US011128271B2

(12) United States Patent
Noguchi et al.

(10) Patent No.: US 11,128,271 B2
(45) Date of Patent: Sep. 21, 2021

(54) POWER SUPPLY CIRCUIT

(71) Applicant: Murata Manufacturing Co., Ltd., Kyoto (JP)

(72) Inventors: Yuuma Noguchi, Kyoto (JP); Hidetoshi Matsumoto, Kyoto (JP); Kiichiro Takenaka, Kyoto (JP); Satoshi Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/720,308

(22) Filed: Dec. 19, 2019

(65) Prior Publication Data

US 2020/0212855 A1 Jul. 2, 2020

(30) Foreign Application Priority Data

Dec. 26, 2018 (JP) .............................. JP2018-243477

(51) Int. Cl.
*H03F 3/24* (2006.01)
*H03F 1/02* (2006.01)
*H04B 1/04* (2006.01)

(52) U.S. Cl.
CPC ............. *H03F 3/24* (2013.01); *H03F 1/0222* (2013.01); *H04B 2001/0408* (2013.01)

(58) Field of Classification Search
CPC .. H03F 3/24; H03F 1/0222; H04B 2001/0408
See application file for complete search history.

(56) References Cited

U.S. PATENT DOCUMENTS

| 6,008,698 A * | 12/1999 | Dacus ................... H03F 1/0211 330/279 |
| 6,781,452 B2 * | 8/2004 | Cioffi .................... H03F 1/0205 330/10 |
| 7,949,316 B2 * | 5/2011 | Takinami ............... H03G 3/004 455/127.1 |
| 8,779,860 B2 * | 7/2014 | Jeon ........................ H03F 1/223 330/311 |

(Continued)

FOREIGN PATENT DOCUMENTS

| CN | 102200791 A | 9/2011 |
| CN | 105486912 A | 4/2016 |

(Continued)

OTHER PUBLICATIONS

Gerard Wimpenny, "Envelope Tracking (ET) PA Characterisation" White Paper, NUJIRA, Feb. 2012, pp. 1-9, NUJIRA.com.

(Continued)

*Primary Examiner* — Freshteh N Aghdam
(74) *Attorney, Agent, or Firm* — Pearne & Gordon LLP

(57) ABSTRACT

A power supply circuit supplies a variable voltage to a power amplifier that amplifies a radio-frequency signal, and includes a transistor and a current detecting resistor. The transistor includes a collector or drain that is supplied with a fixed voltage from a fixed voltage source, a base or gate that receives an envelope signal tracking an envelope of the radio-frequency signal, and an emitter or source that outputs the variable voltage that is based on the envelope signal. The current detecting resistor is electrically connected between the fixed voltage source and the collector or drain of the transistor.

20 Claims, 5 Drawing Sheets

(56) References Cited

U.S. PATENT DOCUMENTS

| | | | | |
|---|---|---|---|---|
| 9,160,376 | B1* | 10/2015 | Scuderi | H03F 1/34 |
| 9,602,059 | B2* | 3/2017 | Knopik | H03F 3/193 |
| 2010/0259231 | A1* | 10/2010 | McCune, Jr. | H02M 3/158 |
| | | | | 323/225 |
| 2015/0084698 | A1* | 3/2015 | Ito | H03F 1/0205 |
| | | | | 330/277 |
| 2015/0270806 | A1* | 9/2015 | Wagh | H03F 1/3247 |
| | | | | 330/296 |
| 2016/0373069 | A1* | 12/2016 | Takenaka | H03F 1/0216 |
| 2018/0226923 | A1 | 8/2018 | Nagamori | |

FOREIGN PATENT DOCUMENTS

| | | |
|---|---|---|
| CN | 108418558 A | 8/2018 |
| CN | 109032241 A | 12/2018 |

OTHER PUBLICATIONS

Pablo F. Miaja et al., "A Linear Assisted DC/DC Converter for Envelope Tracking and Envelope Elimination and Restoration Applications", IEEE Transactions on Power Electronics, July 2012, pp. 3302-3309, vol. 27, No. 7., IEEE.

Office Action for Chinese Patent Application No. 201911315575.1 dated Jul. 2, 2021.

* cited by examiner

POWER SUPPLY CIRCUIT

This application claims priority from Japanese Patent Application No. 2018-243477 filed on Dec. 26, 2018. The content of this application is incorporated herein by reference in its entirety.

BACKGROUND OF THE DISCLOSURE

1. Field of the Disclosure

The present disclosure relates to a power supply circuit.

2. Description of the Related Art

In recent years, an increasing number of power amplifying modules have been employing an envelope tracking (ET) technique as a technique for enhancing the efficiency of a power amplifier mounted in a mobile communication terminal, such as a cellular phone or smartphone. The ET technique is a radio-frequency (RF) amplification technique of controlling the amplitude of a power supply voltage in accordance with the amplitude of an envelope of an RF signal to reduce the power loss that occurs during the operation with a fixed voltage and to realize the enhanced efficiency, and is particularly effective to improve the power-added efficiency in high power operations. For example, there has been disclosed a configuration of driving a power amplifier by using a linear amplifier in a power supply circuit of a power amplifying module employing the ET technique (see, for example, "A Linear Assisted DC/DC Converter for Envelope Tracking and Envelope Elimination and Restoration Applications", IEEE TRANSACTIONS of POWER ELECTRONICS, VOL. 27, No. 7, July 2012). In evaluation of a power amplifier used in a power amplifying module employing the ET technique, the tracking accuracy of a power supply voltage with respect to the envelope of an RF signal is important. For example, there has been disclosed a configuration of monitoring a power supply current of a power amplifier by attaching a probe across a small resistance provided in a power supply path to the power amplifier (see, for example, "Envelope Tracking (ET) PA Characterisation White Paper", nujira pushing the envelope of PA efficiency).

BRIEF SUMMARY OF THE DISCLOSURE

According to the above-mentioned "Envelope Tracking (ET) PA Characterisation White Paper", nujira pushing the envelope of PA efficiency, the small resistance provided in the power supply path to the power amplifier causes a voltage drop. In addition, a parasitic capacitance of the probe, a parasitic inductance of the power supply path, or the like decreases the tracking accuracy of a power supply voltage with respect to the envelope of an RF signal.

Accordingly, it is an object of the present disclosure to provide a power supply circuit capable of suppressing a decrease in the tracking accuracy of a power supply voltage with respect to the envelope of an RF signal.

According to preferred embodiments of the present disclosure, a power supply circuit supplies a variable voltage to a power amplifier that amplifies an RF signal, and includes a transistor and a current detecting resistor. The transistor includes a collector or drain that is supplied with a voltage from a fixed voltage source, a base or gate that receives an envelope signal tracking an envelope of the RF signal, and an emitter or source that outputs the variable voltage that is based on the envelope signal. The current detecting resistor is electrically connected between the fixed voltage source and the collector or drain of the transistor.

With this configuration, it is possible to reduce an influence of a parasitic capacitance of a probe connected to the current detecting resistor or a parasitic inductance of a power supply path on the transistor. Accordingly, a decrease in the tracking accuracy of the variable voltage with respect to the envelope of the RF signal can be suppressed.

According to the preferred embodiments of the present disclosure, it is possible to provide a power supply circuit capable of suppressing a decrease in the tracking accuracy of a power supply voltage with respect to the envelope of an RF signal.

Other features, elements, characteristics and advantages of the present disclosure will become more apparent from the following detailed description of preferred embodiments of the present disclosure with reference to the attached drawings.

BRIEF DESCRIPTION OF THE SEVERAL VIEWS THE DRAWINGS

DETAILED DESCRIPTION OF THE DISCLOSURE

Hereinafter, power supply circuits according to embodiments will be described in detail with reference to the attached drawings. The embodiments do not limit the present disclosure. Each embodiment is an example, and configurations according to different embodiments can of course be partially replaced or combined. In a second embodiment, the same points as those in a first embodiment will not be described, but only different points will be described. In particular, similar functions and effects of similar configurations will not be mentioned in each embodiment.

First Embodiment

Figure 1:
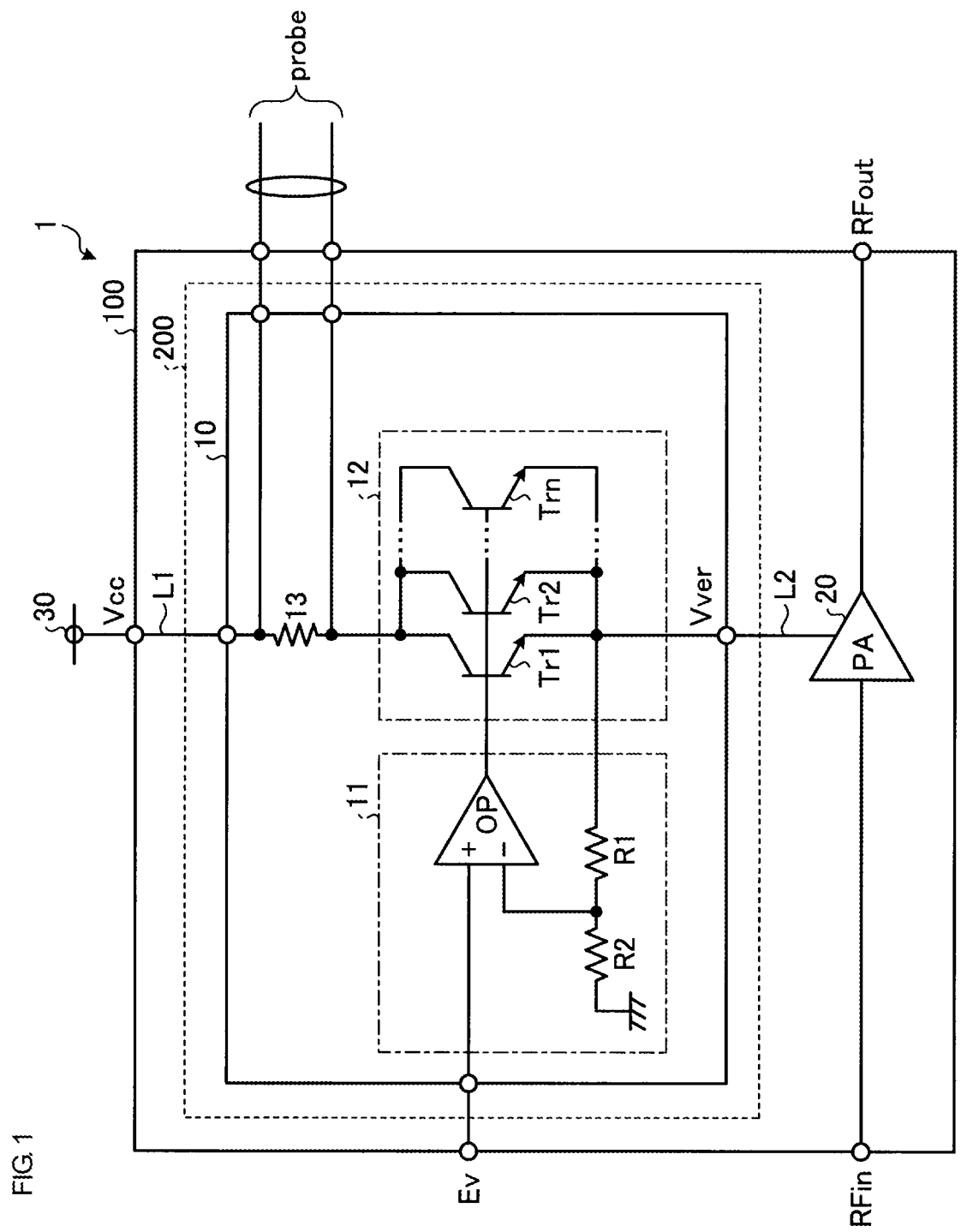
FIG. 1 is a diagram illustrating the configuration of an evaluation jig equipped with a power supply circuit according to a first embodiment.

FIG. 1 is a diagram illustrating the configuration of an evaluation jig 1 equipped with a power supply circuit 10 according to the first embodiment. The evaluation jig 1 illustrated in FIG. 1 is used to evaluate a power amplifier 20 that is used in a power amplifying module employing an envelope tracking (ET) technique. A measuring device for evaluation (not illustrated) is connected to the evaluation jig 1. The evaluation jig 1 receives, from the measuring device for evaluation, a radio-frequency (RF) signal (input signal) RFin and an envelope signal Ev tracking the envelope of the RF signal RFin. The evaluation jig 1 outputs an RF signal (output signal) RFout to the measuring device for evaluation.

The evaluation jig 1 includes a substrate 100 on which the power amplifier 20 as an evaluation target and the power supply circuit 10 are mounted. The power supply circuit 10 supplies a variable voltage Vver to the power amplifier 20.

The power supply circuit 10 may be configured by forming circuit elements on or in a semiconductor chip (die) that is made of, for example, a gallium arsenide (GaAs) semiconductor. The material of the semiconductor chip is not limited to GaAs, but the use of GaAs or the like having a wide band gap enables the power supply circuit 10 to be highly pressure-resistant and excellent in terms of RF characteristics.

The power supply circuit 10 is supplied with a fixed voltage Vcc from a fixed voltage source 30 connected to the evaluation jig 1, generates the variable voltage Vver that is based on the envelope signal Ev received from the measuring device for evaluation, and supplies the variable voltage Vver to the power amplifier 20.

The power supply circuit 10 includes a preamplifier circuit 11 including an operational amplifier OP and resistors R1 and R2, a transistor 12 for amplifying a current, and a current detecting resistor 13 for detecting a current flowing through the transistor 12.

The preamplifier circuit 11 is a component for driving the transistor 12 based on the envelope signal Ev. FIG. 1 illustrates the preamplifier circuit 11 of a voltage feedback type, but the preamplifier circuit 11 is not limited to the configuration illustrated in FIG. 1 and may have any configuration capable of driving the transistor 12. The present disclosure is not limited to the configuration of the preamplifier circuit 11.

The transistor 12 is, for example, a heterojunction bipolar transistor (HBT), but the present disclosure is not limited thereto. The transistor 12 may be a field effect transistor (FET), but it is preferable in the first embodiment that the transistor 12 be an HBT capable of suppressing a decrease in gain in a high frequency band. The following description is based on the assumption that the transistor 12 is an HBT unless otherwise noted.

In the first embodiment, the transistor 12 is a multi-finger transistor including a plurality of unit transistors (n unit transistors in the example illustrated in FIG. 1 (n is an integer equal to or greater than 1)) Tr1, Tr2, . . . , and Trn (also referred to as fingers) that are electrically connected in parallel to each other, as illustrated in FIG. 1. A unit transistor is a minimum unit constituting a transistor. Constituting the transistor 12 by a multi-finger transistor makes it possible to decrease the amount of current in each of the unit transistors Tr1, Tr2, . . . , and Trn while acquiring the amount of current that is to be used to drive the power amplifier 20. Specifically, the amount of current in each of the unit transistors Tr1, Tr2, . . . , and Trn is 1/n times the amount of current flowing through the transistor 12. The number of fingers of the transistor 12, that is, the number n of the unit transistors Tr1, Tr2, . . . , and Trn, is set in accordance with the amount of current to be supplied to the power amplifier 20.

In the following description, the unit transistors Tr1, Tr2, . . . , and Trn will be referred to as the "transistor 12" when it is unnecessary to distinguish them from each other.

The transistor 12 includes a collector that is supplied with the fixed voltage Vcc from the fixed voltage source 30 through the current detecting resistor 13. Specifically, in the first embodiment, the single current detecting resistor 13 is electrically connected between the fixed voltage source 30 and the connection points of the collectors of all the unit transistors Tr1, Tr2, . . . , and Trn included in the transistor 12, and the fixed voltage Vcc is supplied from the fixed voltage source 30. The current detecting resistor 13 has a resistance value of, for example, about 0.1Ω, but is not limited thereto. The transistor 12 includes a base that receives the envelope signal Ev through the preamplifier circuit 11. Specifically, in the first embodiment, the envelope signal Ev is inputted to each of bases of all the unit transistors Tr1, Tr2, . . . , and Trn included in the transistor 12.

The transistor 12 includes an emitter that is electrically connected to a wiring line L2 on the substrate 100. The variable voltage Vver is supplied to the power amplifier 20 through the wiring line L2. Specifically, in the first embodiment, the connection points of the emitters of all the unit transistors Tr1, Tr2, . . . , and Trn included in the transistor 12 are electrically connected to the wiring line L2, and the variable voltage Vver is supplied to the power amplifier 20 through the wiring line L2.

With the above-described configuration, the variable voltage Vver that has been current-amplified by the transistor 12 in accordance with the envelope signal Ev is supplied to the power amplifier 20. In a configuration in which the transistor 12 is an FET, the collector of the transistor 12 is read as "drain", the base of the transistor 12 is read as "gate", and the emitter of the transistor 12 is read as "source". The same applies to the following description.

In the case of evaluating the power amplifier 20 by using the evaluation jig 1, a probe of the measuring device for evaluation (not illustrated) is connected across the current detecting resistor 13. As a result of detecting the voltage across the current detecting resistor 13, a total value of currents flowing through all the unit transistors Tr1, Tr2, . . . , and Trn included in the transistor 12 can be derived as a current flowing through the power amplifier 20.

Figure 2:
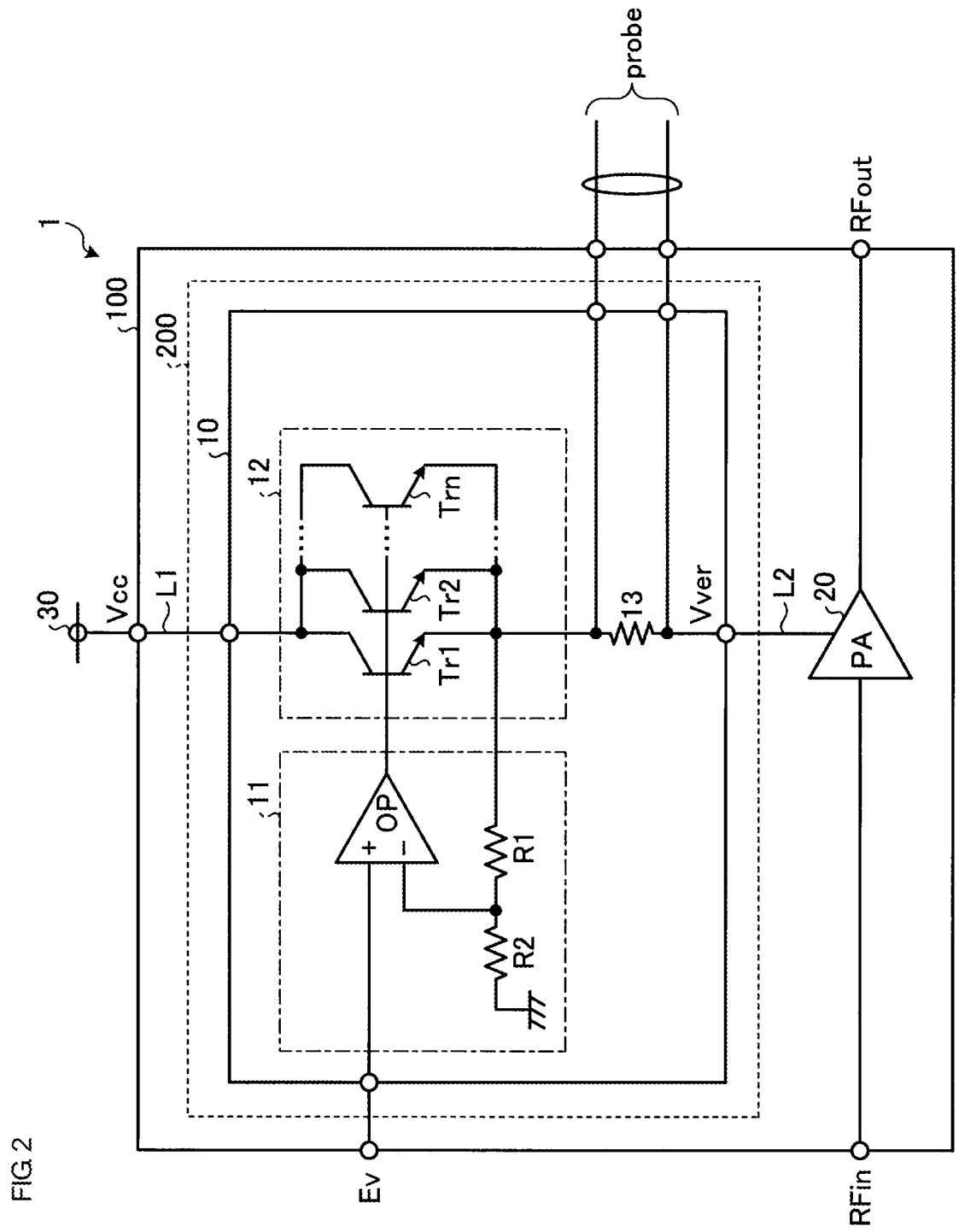
FIG. 2 is a diagram illustrating the configuration of an evaluation jig different from the configuration according to the first embodiment.

FIG. 2 is a diagram illustrating the configuration of an evaluation jig different from the configuration according to the first embodiment. In the configuration illustrated in FIG. 2, the current detecting resistor 13 is electrically connected between the emitter of the transistor 12 and the wiring line L2 on the substrate 100.

In the configuration illustrated in FIG. 2, the current detecting resistor 13 causes a drop in the variable voltage Vver. In addition, a parasitic capacitance of the probe connected across the current detecting resistor 13 to evaluate the power amplifier 20 or a parasitic inductance of a power supply path including the wiring line L2 causes a decrease in the tracking accuracy of the variable voltage Vver with respect to the envelope of an RF signal. The decrease in the tracking accuracy is particularly significant in a high frequency band in which the frequency of an RF signal is above about 100 MHz.

Figure 3:
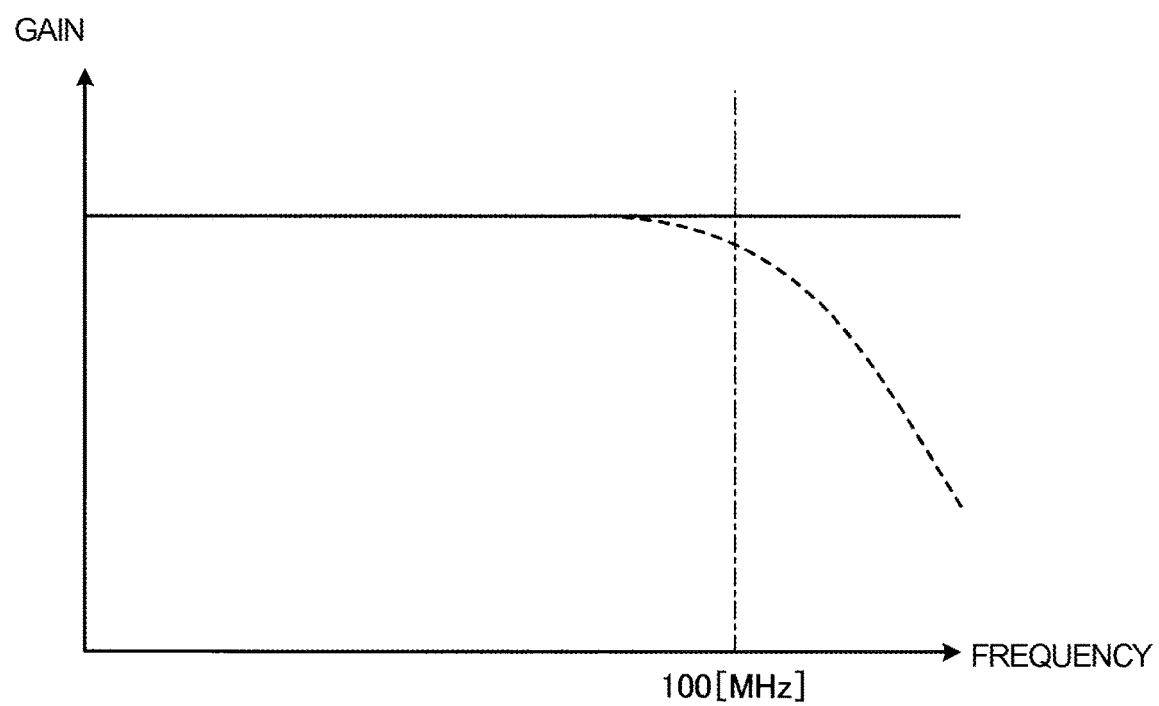
FIG. 3 is a conceptual diagram of frequency-gain characteristics of the configuration according to the first embodiment and the configuration illustrated in FIG. 2.

FIG. 3 is a conceptual diagram of frequency-gain characteristics of the configuration according to the first embodiment and the configuration illustrated in FIG. 2. In FIG. 3, the solid line represents the frequency-gain characteristic of the configuration according to the first embodiment, and the broken line represents the frequency-gain characteristic of the configuration illustrated in FIG. 2. In FIG. 3, the gain represents the ratio of the variable voltage Vver to the voltage of the envelope signal Ev (Vver/Ev). FIG. 3 illustrates an example in which the gain decreases in a high frequency band above about 100 MHz in the configuration illustrated in FIG. 2. The power supply circuit 10 according to the first embodiment includes the current detecting resistor 13 disposed between the fixed voltage source 30 and the collector of the transistor 12. This makes it possible to suppress a drop in the variable voltage Vver. In addition, as illustrated in FIG. 3, a decrease in gain in the high frequency band is suppressed more in the power supply circuit 10 according to the first embodiment than in the configuration illustrated in FIG. 2.

In the configuration illustrated in FIG. 2, the current detecting resistor 13, the parasitic capacitance of the probe, and the parasitic inductance of the power supply path including the wiring line L2 constitute a filter. The filter not only causes a decrease in gain in the high frequency band, but also causes a phase shift with respect to the envelope of an RF signal in the high frequency band. Thus, the tracking accuracy of the variable voltage Vver decreases particularly in the high frequency band.

As described above, in the power supply circuit 10 according to the first embodiment, a decrease in the tracking accuracy of the variable voltage Vver can be suppressed particularly in a high frequency band more than in the configuration illustrated in FIG. 2, and the frequency band in the ET technique can be broadened more than in the configuration illustrated in FIG. 2.

First Modification Example

In a first modification example of the power supply circuit 10 according to the first embodiment, the power supply circuit 10 is flip-chip mounted on the substrate 100, and the wiring line L2 on the substrate 100, which is a part of the power supply circuit to the power amplifier 20, has a characteristic impedance corresponding to a load impedance of the power amplifier 20. The wiring line L2 may be formed of, for example, a transmission line such as a coplanar line, a microstrip line, or a triplate line. Accordingly, electric energy loss caused by reflection can be reduced. With the power supply circuit 10 being flip-chip mounted on the substrate 100, heat can be radiated highly effectively. Furthermore, the wiring length of the wiring line L2 can be increased, and thus the degree of freedom in designing the substrate can be increased.

Second Modification Example

In a second modification example of the power supply circuit 10 according to the first embodiment, a heat sink 200 is disposed at least on the rear surface of the substrate 100 on which the power supply circuit 10 is mounted. As illustrated in FIG. 1, in a case where the transistor 12 includes the plurality of unit transistors Tr1, Tr2, ..., and Trn electrically connected in parallel to each other, each of the unit transistors Tr1, Tr2, ..., and Trn generates heat, and thus a large amount of heat is generated. By disposing the heat sink 200 at least on the rear surface of the substrate 100 on which the power supply circuit 10 is mounted, a thermal resistance can be decreased and the temperature of the power supply circuit 10 can be decreased.

Second Embodiment

Figure 4:
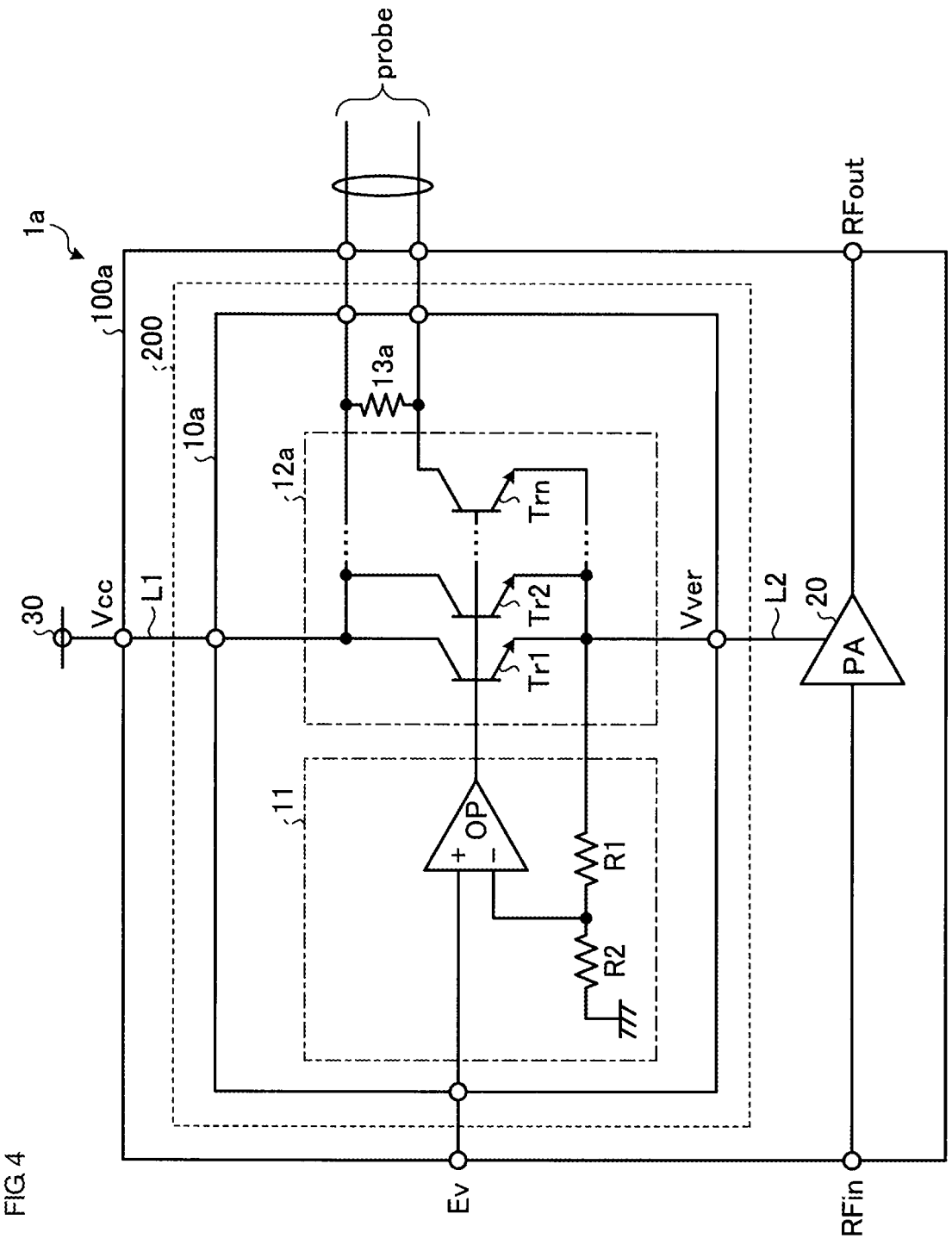
FIG. 4 is a diagram illustrating the configuration of an evaluation jig equipped with a power supply circuit according to a second embodiment.

FIG. 4 is a diagram illustrating the configuration of an evaluation jig 1a equipped with a power supply circuit 10a according to the second embodiment. The same components as those of the first embodiment are denoted by the same reference numerals, and the description thereof is omitted. In FIG. 4, the power supply circuit 10a according to the second embodiment is mounted on a substrate 100a of the evaluation jig 1a. In the example illustrated in FIG. 4, a single current detecting resistor 13a is disposed between the fixed voltage source 30 and the collector of the unit transistor Trn among all the unit transistors Tr1, Tr2, ..., and Trn included in a transistor 12a. That is, in the configuration illustrated in FIG. 4, the connection points of the collectors of the unit transistors except for the unit transistor Trn are electrically connected to the fixed voltage source 30 without the current detecting resistor 13a interposed therebetween.

In the configuration illustrated in FIG. 4, the current flowing through the current detecting resistor 13a is 1/n relative to that in the configuration described in the first embodiment. That is, when the current detecting resistor 13 according to the first embodiment has a resistance value of about $0.1\Omega$, for example, the current detecting resistor 13a according to the second embodiment has a resistance value of about $0.1 \times n\Omega$, for example. The resistance value of the current detecting resistor 13a is not limited thereto.

In the configuration according to the second embodiment, the current flowing through the power amplifier 20 can be calculated by detecting the voltage across the current detecting resistor 13a, deriving the current flowing through the unit transistor Trn, and multiplying the derived current by n.

In the configuration described in the first embodiment, the current detecting resistor 13 disposed between the fixed voltage source 30 and the collector of the transistor 12 causes an increase in the thermal resistances of the unit transistors Tr1, Tr2, ..., and Trn included in the transistor 12. In contrast, in the configuration of the power supply circuit 10a according to the second embodiment, the thermal resistances of the unit transistors except for the unit transistor provided with the current detecting resistor 13a (in the example illustrated in FIG. 4, the unit transistor Trn) decrease more than in the configuration described in the first embodiment. That is, a wiring line L1 that is on the substrate 100a and extends to the fixed voltage source 30 effectively functions as a heat radiation path for the transistor 12a. Accordingly, the temperature of the power supply circuit 10a can be decreased. In addition, the power consumed by the current detecting resistor 13a and the heat generated by the current detecting resistor 13a can be reduced.

In the configuration described in the first embodiment, the mirror effect of all the unit transistors Tr1, Tr2, ..., and Trn included in the transistor 12 deteriorates the frequency characteristic of the power supply circuit 10. In contrast, in the configuration of the power supply circuit 10a according to the second embodiment, the frequency characteristic of the power supply circuit 10a is less susceptible to the mirror effect of the unit transistors except for the unit transistor provided with the current detecting resistor 13a (in the example illustrated in FIG. 4, the unit transistor Trn). Thus, a decrease in the tracking accuracy of the variable voltage Vver can be suppressed and the frequency band in the ET technique can be broadened more than in the configuration described in the first embodiment.

In the configuration according to the second embodiment, as in the first modification example of the first embodiment, the power supply circuit 10a is flip-chip mounted on the substrate 100a, and the wiring line L2 on the substrate 100a, which is a part of the power supply circuit to the power amplifier 20, has a characteristic impedance corresponding to a load impedance of the power amplifier 20. Accordingly, the electric energy loss caused by reflection can be reduced. With the power supply circuit 10a being flip-chip mounted on the substrate 100a, heat can be radiated highly effectively.

In the configuration according to the second embodiment, as in the second modification example of the first embodiment, the heat sink 200 is disposed at least on the rear surface of the substrate 100a on which the power supply circuit 10a is mounted. Accordingly, the temperature of the power supply circuit 10a can further be decreased.

Modification Example

Figure 5:
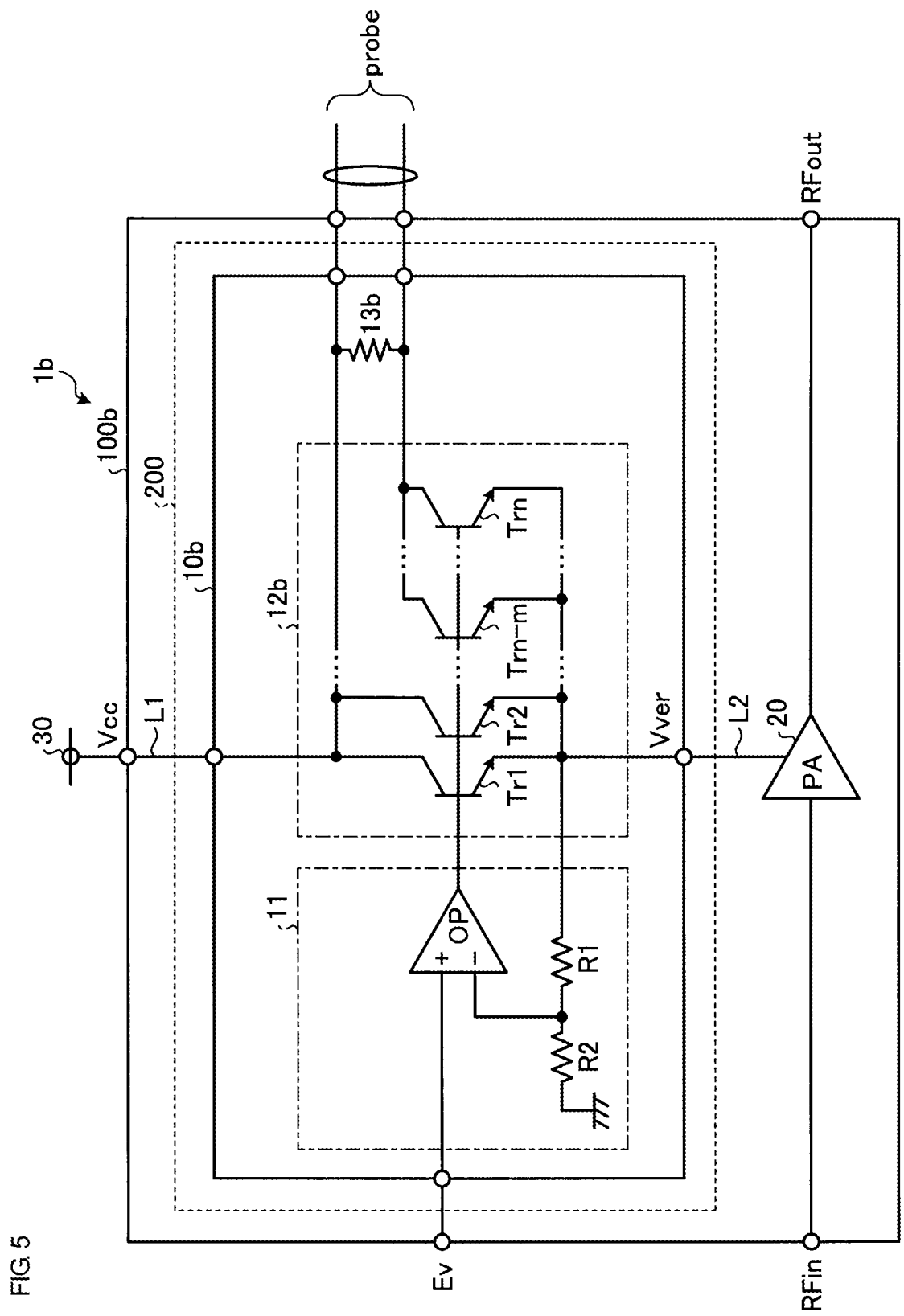
FIG. 5 is a diagram illustrating the configuration of an evaluation jig equipped with a power supply circuit according to a modification example of the second embodiment.

FIG. 5 is a diagram illustrating the configuration of an evaluation jig 1b equipped with a power supply circuit 10b according to a modification example of the second embodiment. The same components as those illustrated in FIG. 4 are denoted by the same reference numerals, and the description thereof is omitted. In FIG. 5, the power supply circuit 10b according to the modification example of the second embodiment is mounted on a substrate 100b of the evaluation jig 1b.

In the configuration illustrated in FIG. 4, the single current detecting resistor 13a is disposed between the fixed voltage source 30 and the single unit transistor Trn among all the unit transistors Tr1, Tr2, . . . , and Trn included in the transistor 12. Alternatively, as illustrated in FIG. 5, a single current detecting resistor 13b may be disposed between the fixed voltage source 30 and the connection points of the collectors of m unit transistors Trn-m, . . . , and Trn (m is an integer equal to or greater than 2 and equal to or smaller than n) among all the unit transistors (n unit transistors) Tr1, Tr2, . . . , Trn-m, . . . , and Trn included in a transistor 12b. In this case, the current flowing through the current detecting resistor 13b is m/n times that in the configuration described in the first embodiment. That is, when the current detecting resistor 13 according to the first embodiment has a resistance value of about 0.1Ω, for example, the current detecting resistor 13b according to the modification example of the second embodiment illustrated in FIG. 5 has a resistance value of about 0.1×n/mΩ, for example. In this case, the current flowing through the power amplifier 20 can be calculated by detecting the voltage across the current detecting resistor 13b, deriving the current flowing through the m unit transistors Trn-m, . . . , and Trn connected to the current detecting resistor 13b, and multiplying the derived current by n/m.

In the configuration of the power supply circuit 10b according to the modification example of the second embodiment, the thermal resistances of the unit transistors except for the unit transistors provided with the current detecting resistor 13b (in the example illustrated in FIG. 5, the unit transistors Trn-m, . . . , and Trn) decrease more than in the configuration described in the first embodiment. That is, the wiring line L1 that is on the substrate 100b and extends to the fixed voltage source 30 effectively functions as a heat radiation path for the transistor 12b. Accordingly, the temperature of the power supply circuit 10b can be decreased. Furthermore, the power consumed by the current detecting resistor 13b and the heat generated by the current detecting resistor 13b can be reduced. In the configuration of the power supply circuit 10b according to the modification example of the second embodiment, an influence of the mirror effect of the unit transistors except for the unit transistors provided with the current detecting resistor 13b (in the example illustrated in FIG. 5, the unit transistors Trn-m, . . . , and Trn) is reduced. Accordingly, the parasitic capacitance of the probe can be reduced. Thus, a decrease in the tracking accuracy of the variable voltage Vver can be suppressed and the frequency band in the ET technique can be broadened more than in the configuration described in the first embodiment.

In the configuration according to the modification example of the second embodiment, as in the first modification example of the first embodiment, the power supply circuit 10b is flip-chip mounted on the substrate 100b, and the wiring line L2 on the substrate 100b, which is a part of the power supply circuit to the power amplifier 20, has a characteristic impedance corresponding to a load impedance of the power amplifier 20. Accordingly, the electric energy loss caused by the reflection can be reduced. With the power supply circuit 10b being flip-chip mounted on the substrate 100b, heat can be radiated highly effectively.

In the configuration according to the modification example of the second embodiment, as in the second modification example of the first embodiment, the heat sink 200 is disposed at least on the rear surface of the substrate 100b on which the power supply circuit 10b is mounted. Accordingly, the temperature of the power supply circuit 10b can further be decreased.

The configuration illustrated in FIG. 5 is applicable to the configuration according to the first embodiment illustrated in FIG. 1 and to the configuration illustrated in FIG. 4 by setting m to an integer equal to or greater than 1 and equal to or smaller than n. That is, when m=n is satisfied in the configuration illustrated in FIG. 5, the configuration illustrated in FIG. 5 can be replaced with the configuration according to the first embodiment illustrated in FIG. 1. When m=1 is satisfied in the configuration illustrated in FIG. 5, the configuration illustrated in FIG. 5 can be replaced with the configuration illustrated in FIG. 4.

In the above-described embodiments, each of the current detecting resistors 13, 13a, and 13b may be disposed on or in a semiconductor chip that constitutes a corresponding one of the power supply circuits 10, 10a, and 10b, or may be disposed on a corresponding one of the substrates 100, 100a, and 100b. Although a description has been given of examples in which the power supply circuits 10, 10a, and 10b are respectively mounted on the evaluation jigs 1, 1a, and 1b in the above-described embodiments, the power supply circuits 10, 10a, and 10b may be applied to the power amplifying module equipped with the power amplifier 20. Accordingly, the frequency band supported by the power amplifying module can be broadened.

The description of the embodiments has been given to facilitate the understanding of the present disclosure and is not intended to limit the present disclosure. The present disclosure can be changed or improved without deviating from the gist thereof and includes the equivalents thereof.

The present disclosure can take the following configurations as described above or instead of the above-described configurations.

(1) A power supply circuit according to preferred embodiments of the present disclosure is a power supply circuit that supplies a variable voltage to a power amplifier that amplifies a radio-frequency signal, and includes a transistor and a current detecting resistor. The transistor includes a collector or drain that is supplied with a voltage from a fixed voltage source, a base or gate that receives an envelope signal tracking an envelope of the radio-frequency signal, and an emitter or source that outputs the variable voltage that is based on the envelope signal. The current detecting resistor is electrically connected between the fixed voltage source and the collector or drain of the transistor.

With this configuration, it is possible to reduce an influence of a parasitic capacitance of a probe connected to the current detecting resistor or a parasitic inductance of a power supply path on the transistor. Accordingly, a decrease in the tracking accuracy of the variable voltage with respect to the envelope of the radio-frequency signal can be suppressed.

(2) In the power supply circuit according to the above-described (1), the transistor includes a plurality of unit transistors electrically connected in parallel to each other. With this configuration, it possible to reduce the amount of current of each unit transistor.

(3) In the power supply circuit according to the above-described (2), the current detecting resistor is connected between the fixed voltage source and connection points of collectors or drains of all the unit transistors included in the transistor.

With this configuration, it possible to derive a total value of currents flowing through all the unit transistors included in the transistor as a current flowing through the power amplifier by detecting the voltage across the current detecting resistor.

(4) In the power supply circuit according to the above-described (2), the current detecting resistor is connected between the fixed voltage source and a collector or drain of one unit transistor among all the unit transistors included in the transistor.

With this configuration, when the total number of all the unit transistors included in the transistor is n (n is an integer equal to or greater than 1), the current flowing through the power amplifier 20 can be calculated by detecting the voltage across the current detecting resistor, deriving the current flowing through the one unit transistor connected to the current detecting resistor, and multiplying the derived current by n.

In addition, the thermal resistances of the unit transistors connected to the fixed voltage source without the current detecting resistor interposed therebetween decrease, and heat generation is suppressed. In addition, the parasitic capacitance of the probe can further be reduced, and a decrease in the tracking accuracy of the power supply voltage with respect to the envelope of the radio-frequency signal can further be suppressed.

(5) In the power supply circuit according to the above-described (2), the current detecting resistor is connected between the fixed voltage source and connection points of collectors or drains of a plurality of unit transistors among all the unit transistors included in the transistor, and collectors or drains of remaining unit transistors are connected to the fixed voltage source.

With this configuration, when the total number of all the unit transistors included in the transistor is n (n is an integer equal to or greater than 1) and the number of unit transistors connected to the current detecting resistor is m (m is an integer equal to or greater than 2 and equal to or smaller than n), the current flowing through the power amplifier 20 can be calculated by detecting the voltage across the current detecting resistor, deriving the current flowing through the m unit transistors connected to the current detecting resistor, and multiplying the derived current by n/m. In addition, the thermal resistances of the unit transistors connected to the fixed voltage source without the current detecting resistor interposed therebetween decrease, and heat generation is suppressed. In addition, the parasitic capacitance of the probe can further be reduced, and a decrease in the tracking accuracy of the power supply voltage with respect to the envelope of the radio-frequency signal can further be suppressed. Furthermore, since the parasitic capacitance of the probe can be reduced, the power supply circuit is less susceptible to the parasitic capacitance of the probe.

(6) In the power supply circuit according to any one of the above-described (1) to (5), the transistor is a heterojunction bipolar transistor.

With this configuration, a decrease in gain in a high frequency band can be suppressed. Furthermore, each circuit can be configured on or in one chip, and thus the size of the circuit can be reduced and oscillation can be prevented.

(7) In the power supply circuit according to any one of the above-described (1) to (6), a semiconductor chip including at least the transistor is flip-chip mounted on a substrate. With this configuration, the power supply circuit that radiates heat highly effectively can be obtained.

(8) In the power supply circuit according to the above-described (7), the semiconductor chip is made of a gallium arsenide (GaAs) semiconductor.

With this configuration, the power supply circuit that is highly pressure-resistant and excellent in terms of radio-frequency characteristics can be obtained.

(9) In the power supply circuit according to the above-described (7) or (8), the power amplifier is disposed on the substrate.

With this configuration, it is possible to configure an evaluation jig for a power amplifier or a power amplifying module having a broadened frequency band.

(10) In the power supply circuit according to the above-described (9), a power supply path between the semiconductor chip and the power amplifier has a characteristic impedance corresponding to a load impedance of the power amplifier. With this configuration, electric energy loss caused by reflection can be reduced.

(11) In the power supply circuit according to the above-described (10), the power supply path is formed of a coplanar line.

(12) In the power supply circuit according to the above-described (10), the power supply path is formed of a microstrip line.

(13) In the power supply circuit according to the above-described (10), the power supply path is formed of a triplate line.

According to the present disclosure, a decrease in the tracking accuracy of a power supply voltage with respect to the envelope of a radio-frequency signal can be suppressed.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power supply circuit that supplies a variable voltage to a power amplifier that amplifies a radio-frequency signal, the power supply circuit comprising:
   a transistor including a collector or drain that is supplied with a voltage from a fixed voltage source, a base or gate that receives an envelope signal tracking an envelope of the radio-frequency signal, and an emitter or source that outputs the variable voltage that is based on the envelope signal; and
   a current detecting resistor electrically connected between the fixed voltage source and the collector or drain of the transistor.

2. The power supply circuit according to claim 1, wherein the transistor includes a plurality of unit transistors electrically connected in parallel to each other.

3. The power supply circuit according to claim 2, wherein the current detecting resistor is connected between the fixed voltage source and connection points of collectors or drains of all of the plurality of unit transistors included in the transistor.

4. The power supply circuit according to claim 2, wherein the current detecting resistor is connected between the fixed voltage source and a collector or drain of one unit transistor among all of the plurality of unit transistors included in the transistor.

5. The power supply circuit according to claim 2, wherein the current detecting resistor is connected between the fixed voltage source and connection points of collectors or drains of some of the plurality of unit transistors included in the transistor, and collectors or drains of remaining unit transistors of the plurality of unit transistors are connected to the fixed voltage source.

6. The power supply circuit according to claim 1, wherein the transistor is a heterojunction bipolar transistor.

7. The power supply circuit according to claim 2, wherein the transistor is a heterojunction bipolar transistor.

8. The power supply circuit according to claim 1, wherein a semiconductor chip including at least the transistor is flip-chip mounted on a substrate.

9. The power supply circuit according to claim 8, wherein the semiconductor chip includes the current detecting resistor.

10. The power supply circuit according to claim 2, wherein a semiconductor chip including at least the transistor is flip-chip mounted on a substrate.

11. The power supply circuit according to claim 8, wherein the semiconductor chip is made of a gallium arsenide (GaAs) semiconductor.

12. The power supply circuit according to claim 8, wherein the power amplifier is disposed on the substrate.

13. The power supply circuit according to claim 11, wherein the power amplifier is disposed on the substrate.

14. The power supply circuit according to claim 12, wherein a power supply path between the semiconductor chip and the power amplifier has a characteristic impedance corresponding to a load impedance of the power amplifier.

15. The power supply circuit according to claim 14, wherein the power supply path comprises a coplanar line.

16. The power supply circuit according to claim 14, wherein the power supply path comprises a microstrip line.

17. The power supply circuit according to claim 14, wherein the power supply path comprises a triplate line.

18. A power amplifier module comprising:
a first amplifier that amplifies a first signal; and
a power supply circuit comprising:
a transistor including a collector or drain that is supplied with a voltage from a fixed voltage source, a base or gate that receives an envelope signal tracking an envelope of the radio-frequency signal, and an emitter or source that outputs the variable voltage that is based on the envelope signal; and
a current detecting resistor electrically connected between the fixed voltage source and the collector or drain of the transistor,
wherein the power supply circuit and the first amplifier are mounted on a module substrate.

19. The power amplifier module according to claim 18, wherein a semiconductor chip including at least the transistor is flip-chip mounted on a substrate.

20. A power supply circuit that supplies a variable voltage to a power amplifier that amplifies a radio-frequency signal, the power supply circuit comprising:
a transistor including a collector or drain that is supplied with a voltage from a fixed voltage source, a base or gate that receives an envelope signal tracking an envelope of the radio-frequency signal, and an emitter or source that outputs the variable voltage that is based on the envelope signal; and
a current detecting resistor electrically and serially connected between the emitter or source of the transistor and a wiring line that supplies the variable voltage to the power amplifier.

\* \* \* \* \*